US010558765B2

(12) United States Patent
Samuel et al.

(10) Patent No.: US 10,558,765 B2
(45) Date of Patent: Feb. 11, 2020

(54) LUMPED DATA MODELING OF TOOL JOINT EFFECTS IN UNDERBALANCED DRILLING

(71) Applicant: LANDMARK GRAPHICS CORPORATION, Houston, TX (US)

(72) Inventors: Robello Samuel, Cypress, TX (US); Xiaoqian Huang, Katy, TX (US)

(73) Assignee: Landmark Graphics Corporation, Houston, TX (US)

( * ) Notice: Subject to any disclaimer, the term of this patent is extended or adjusted under 35 U.S.C. 154(b) by 63 days.

(21) Appl. No.: 15/035,482

(22) PCT Filed: Nov. 27, 2013

(86) PCT No.: PCT/US2013/072336
§ 371 (c)(1),
(2) Date: May 9, 2016

(87) PCT Pub. No.: WO2015/080740
PCT Pub. Date: Jun. 4, 2015

(65) Prior Publication Data
US 2016/0292322 A1 Oct. 6, 2016

(51) Int. Cl.
G06G 7/48 (2006.01)
G06F 17/50 (2006.01)
E21B 41/00 (2006.01)
E21B 21/00 (2006.01)

(52) U.S. Cl.
CPC ...... G06F 17/5009 (2013.01); E21B 41/0092 (2013.01); E21B 2021/006 (2013.01)

(58) Field of Classification Search
CPC .. G06F 17/5009; E21B 41/0092; E21B 47/06; E21B 47/08
USPC .................................................. 703/7, 9, 10
See application file for complete search history.

(56) References Cited

U.S. PATENT DOCUMENTS

2003/0094276 A1* 5/2003 Smith, Jr. ............ E21B 33/085
166/84.3
2003/0196804 A1 10/2003 Riet et al.
2004/0060737 A1* 4/2004 deBoer ................. E21B 21/001
175/7

(Continued)

OTHER PUBLICATIONS

Examiner's Letter from the Canadian Intellectual Property Office dated Apr. 25, 2017.

(Continued)

Primary Examiner — Andre Pierre Louis
(74) Attorney, Agent, or Firm — Locke Lord LLP

(57) ABSTRACT

In one embodiment, the invention provides a computer implemented method for determining underbalanced drilling conditions. The method may include determining the number of tool joints in a segment of drill string, where each tool joint has a length and an inner diameter and an outer diameter, determining the total length of all tool joints in a segment of drill string, determining the total length of the segment of drill string excluding the tool length of all tool joints in the segment of drill string, wherein the drill string has an inner diameter and an outer diameter, determining the inner diameter of a segment of wellbore encompassing a segment of drill string, and determining a pressure drop in the segment of wellbore, based on the total length of all tool joints in the segment of drill string.

9 Claims, 4 Drawing Sheets

(56) References Cited

U.S. PATENT DOCUMENTS

| | | | |
|---|---|---|---|
| 2005/0192855 A1* | 9/2005 | Chitty | E21B 43/00 705/1.1 |
| 2005/0194185 A1 | 9/2005 | Gleitman | |
| 2005/0284663 A1* | 12/2005 | Hall | E21B 47/122 175/48 |
| 2006/0162962 A1* | 7/2006 | Koederitz | E21B 45/00 175/27 |
| 2012/0278053 A1 | 11/2012 | Garcia et al. | |
| 2013/0304444 A1 | 11/2013 | Strobel et al. | |

OTHER PUBLICATIONS

International Preliminary Report on Patentability for PCT Application No. PCT/US2013/072336 dated May 31, 2016.
Copenheaver, PCT Search Report for PCT Application No. PCT/US2013/072336 dated Apr. 28, 2014.
Copenheaver, PCT Written Opinion for PCT Application No. PCT/US2013/072336 dated Apr. 28, 2014.

* cited by examiner

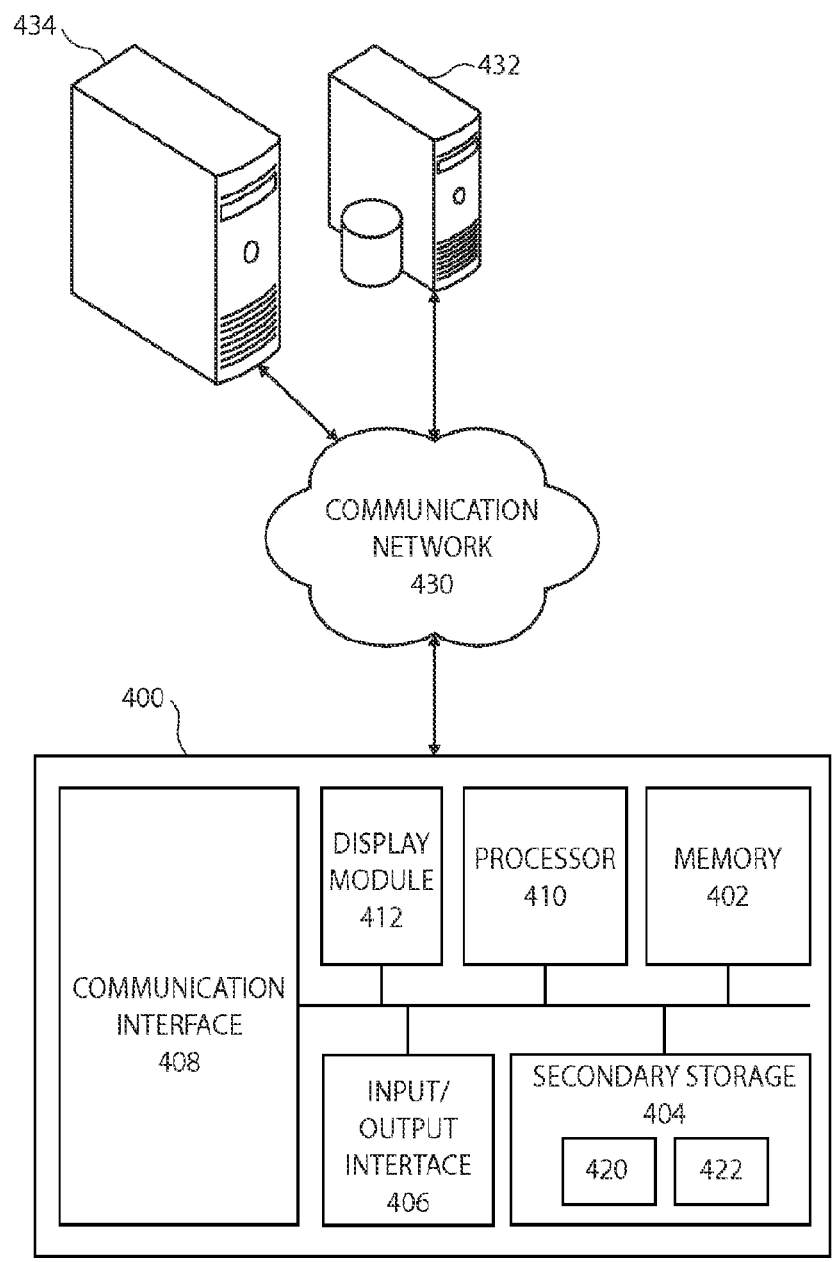

LUMPED DATA MODELING OF TOOL JOINT EFFECTS IN UNDERBALANCED DRILLING

FIELD OF INVENTION

The embodiments disclosed herein relate generally to methods and systems for Underbalanced Drilling ("UBD"), in particular, to methods and systems for modeling the effects of tool joints in the drilling string.

BACKGROUND OF INVENTION

Underbalanced drilling is a technique used to drill oil and gas wells. Unlike traditional over-balanced drilling, the wellbore pressure is kept lower than the formation pressure. Underbalanced drilling provides several advantages over over-balanced drilling. It reduces drilling fluid invasion of the wellbore, which decreases wellbore damage and can reduce clean-up time and improve recovery. It also allows the well to produce during drilling, which can increase the knowledge about the well itself. Computer modeling is an important tool for performing underbalanced drilling. An accurate and realistic computer model helps engineers to select drilling strings and operation parameters to achieve better performance and reduce the underbalanced drilling operation costs. One important UBD calculation is calculating the pressure drop through the drilling string and annulus. Conventionally, UBD calculations may be performed by suitable well planning software. However, conventional models are not satisfactory because they do not accurately model the pressure drops caused by the effect of tool joints in the drilling string and in the annulus. The cumulative effect of the chocking pressures caused by the tool joints can have a significant effect over the length of the wellbore. Therefore, there is a need in the art for tools that allow under balance drilling engineers a more accurate, realistic, and reliable under balance drilling analysis, taking into account the actual conditions in the drill string and casing.

BRIEF DESCRIPTION OF DRAWINGS

FIG. 4 is a schematic diagram of a computer system according to embodiments of the invention.

DETAILED DESCRIPTION OF DISCLOSED EMBODIMENTS

Figure 1:
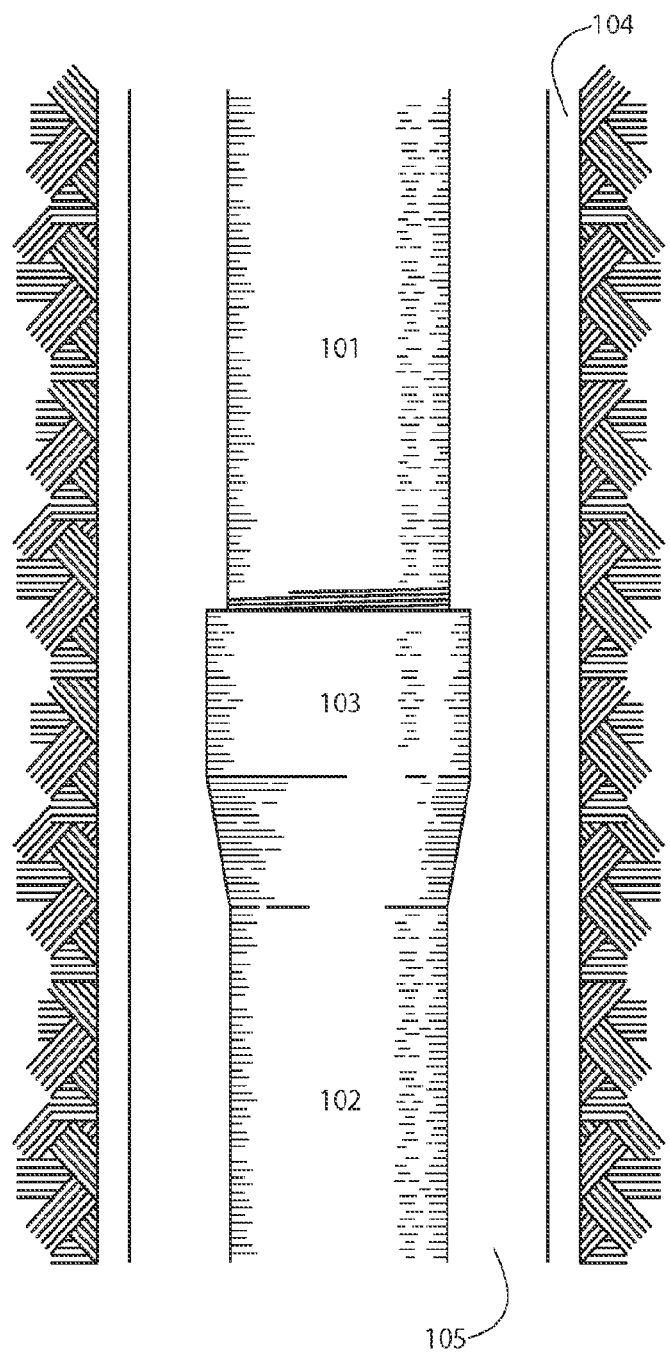
FIG. 1 is a plan view of an exemplary upset tool joint used in UBD operations according to embodiments of the invention.

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Embodiments of the invention provide for lumped data modeling of tool joint effects in underbalanced drilling. In one embodiment, the method be implemented as a single computer software program. In other embodiments, the method may be implemented as modules or algorithms that cooperate with other computer software programs that provide software routines, such as calculation engines and graphical user interfaces ("GUIs"), that will be familiar to those of skill in the art. For example, one software package useful with embodiments of the invention is the Decision-Space Well Engineer available from Landmark Graphics Corp., which provides, for example, calculation modules useful to determine the pressure drops in the wellbore based on the dimensions and specifications of the wellbore components according to mathematical models known to those of skill in the art. Of course, embodiments of the invention are not restricted to any particular software implementation and embodiments may be adapted to cooperate with any suitable pressure calculation models that will be known to those of skill in the art.

In one implementation, a well engineer first creates a computer model of the string and wellbore array used in the well. These arrays may be created in the computer memory and contain information reflecting the configuration of the casing string and drill pipe. For example, in the wellbore array, information regarding the wellbore, including the casing, is supplied. The information involving the casing would include information regarding the inner diameter of the casing and the total casing length, broken down in segments of a pre-selected length. The wellbore array would also contain the size and length of any open hole in the wellbore. The computer model also includes a string array containing information reflecting the drill pipe string in the wellbore. This information includes the pipe length, pipe outer diameter, pipe inner diameter, tool joint outer diameter, tool joint inner diameter, and tool joint length. The string array would also contain any information regarding the size, type, and length of the bottom hole assembly. Other information in the computer model would include a survey array. The survey array includes the well path deviation necessary to perform underbalanced drilling calculations. According to an embodiment of the invention, a calculation array is then used in the performance of the calculations based on the parameters stored in the string, wellbore, and survey arrays.

In an underbalanced drilling environment, number of different components may be used in a wellbore. Some of these components, including segments of the drill pipe itself, are incorporated into the drill string using what are known as upset joints. An upset joint is a type of tool joint in which the outer diameter of the female end of the joint is enlarged so that the pipe wall is not decreased in thickness to accommodate the mating threads of the connection. For example, a drill pipe segment with a nominal 5-inch outer diameter ("OD"), may have a 6-inch OD at the tool joint.

FIG. 1 depicts an upset tool joint useful with embodiments of the invention. A first pipe segment 101 is connected to a second pipe segment 102 by a tool joint 103. The drilling string is located downhole in casing 104. The increased OD at the tool joint 103 creates a choke pressure in the annulus 105 between the inner diameter of the casing 104 and the outer diameter of the tool joint 103. The pressure drop in this portion of the annulus along the length of the tool joint is different than the pressure drop in the annulus along the length of the drill pipe that excludes the length of the tool joint. The difference depends on the inside diameter or the annulus diameter change.

Further, there is typically provided a taper section inside the tool joint 103 itself that also creates a pressure drop that is different than the pressure drop inside the drill pipe 102 along the length of the drill pipe section excluding the length of the tool joint.

For a single tool joint, the impact on the UBD calculations may not be particularly signification, for example 2-3 psi of additional pressure drop across the tool joint. However, in a wellbore that may be several thousand feet deep, the cumulative effect can substantially impact the UBD calculations. According to an embodiment of the invention, a computer implemented method is provided to accurately take into account the effect of the tool joints in a lumped data model that distinguishes between the effect of the drilling pipe along lengths with no tool joint and the tool joints themselves.

Figure 2:
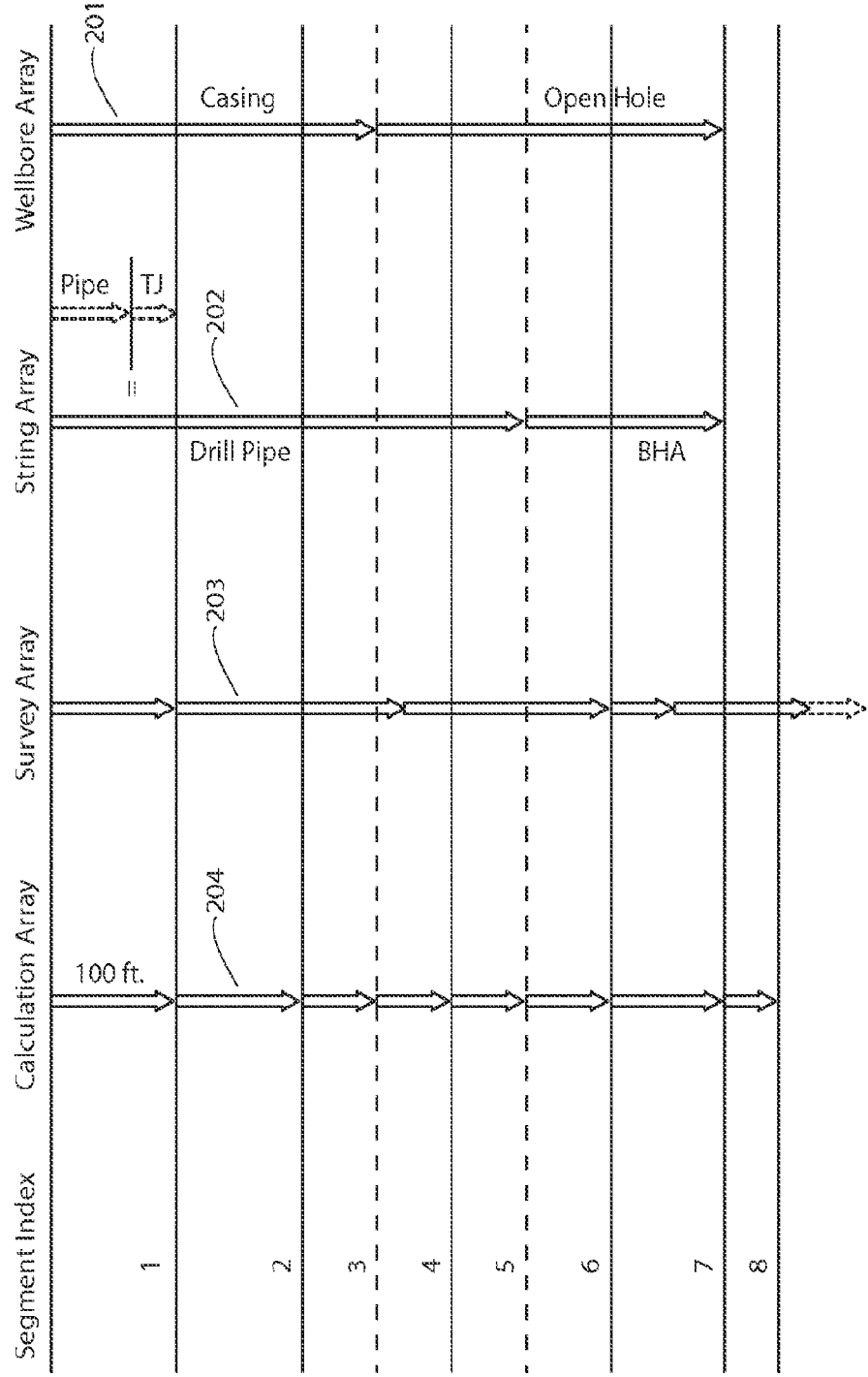
FIG. 2 is a schematic diagram representing arrays useful in embodiments of the invention.

It will be understood that the physical drilling environment is modeled in computer memory. One embodiment of the method uses a plurality of arrays created in computer memory that contain information reflecting the physical components and parameters of the wellbore. FIG. 2 is a schematic diagram illustrating the implementation of the arrays according to an embodiment of the invention. In this case, the wellbore has been divided into eight different segments, each with an assigned segment index 1-8. The length of each segment in the embodiment shown is nominally 100 feet, although, according to embodiments of the invention, a segment may be subdivided upon certain conditions, such as a transition from casing to open hole in the wellbore array 201 or from a transition from drill pipe to bottom hole assembly in the string array 202. Such subdivision is useful to accurately model the physical reality of the wellbore. For example, in the middle of the third segment from the surface, in the embodiment depicted, the wellbore changes from casing to open hole. This impacts the UBD calculations at the tool joints because the annulus area will typically be somewhat smaller in the open hole than in the casing for a given diameter of drill pipe. Therefore, in an embodiment, the segment is divided into segments 3 and 4, with segment 4 representing the beginning of open hole conditions in the wellbore.

Similarly, in the fourth 100 foot segment from the surface, which is now segment index 5, it is seen that the drill string transitions from drill pipe to bottom hole assembly ("BHA"). In this embodiment, there are no tool joints to be considered in the UBD calculations related to the BHA. Therefore, this index is divided into segment index 5 and segment index 6, which reflects the beginning of the BHA in the drill string. These transitions mark transition regions in the wellbore where the parameters for the lump data model will have to change, or where no tool joint affects will need to be modeled. It will be appreciated that the lengths of the segments are arbitrary, and other convenient lengths may be used by those of ordinary skill in the art.

In one embodiment, the method sets up and implements the lumped data model to count into the tool joints' effect in underbalanced drilling. This provides UBD engineers with more accurate, more realistic and more reliable UBD analysis results. It also allows UBD engineers to visualize the tool joints' effect in UBD output plots and improves decision making on how to select drilling strings and operation parameters to achieve the better performance and reduce the UBD operation cost.

UBD calculations useful with embodiments of the invention include multiphase flow calculations which will be known to those of skill in the art.

The wellbore array 201 contains information regarding the structure of the wellbore. This information may be input through a suitable user interface. The interface may include a computer display screen for providing the UBD engineer a graphical user interface ("GUI") with entry fields to accept the parameters defining the wellbore. The UBD engineer may enter the wellbore parameters into the entry fields using a suitable input device, such as a keyboard or mouse. In other embodiments, information reflecting the wellbore specifications may be provided from a computer readable medium, such as a hard disk or flash memory card coupled to a computer system executing a computer implemented method according to an embodiment of the invention, or the information may be provided through a computer network connection, such as an Internet connection or a local Ethernet connection, or similar.

The wellbore array 201 includes the inner diameter, outer diameter, and length for each section of casing in each segment of the wellbore. It also includes the inner diameter and length of any open hole portion of the wellbore. Generally, the wellbore is cemented in place in the formation. Any tool joints that may exist in the casing are generally negligible and may be disregarded in some embodiments of the invention. However, in some circumstances, for example, when the casing is used in the drilling process, such as in directional liner drilling ("DLD"), any tool joints in the casing may be considered by the lump data model.

The string array 202 includes information regarding the structure of the drill string and may be entered into the model in the same ways as the wellbore array. The string array includes the pipe length, pipe outer diameter, pipe inner diameter, tool joint length, tool joint outer diameter, tool joint inner diameter, and tool joint type, such as whether it is an upset tool joint, for each segment of drilling pipe in the drill string. The string array also includes information regarding the BHA and any other components incorporated in the drill string. Upset tool joints are conventionally found in drilling string types such as drilling pipe, heavy weight drilling pipe or tubular pipe, in the type of drilling string may be stored in the string array.

Other information relevant to the UBD calculations for the well may also be stored in the arrays accessible in embodiments of the invention. For example, in some embodiments a survey array is provided. The survey array 203 provides the well path deviation for each segment of the well. This information allows UBD calculations to take into account the inclination of the wellbore at each segment along the wellbore.

According to embodiments of the method, a calculation array 204 may be set up to track and summarize the pressure drops at each segment along the length of the wellbore. In one embodiment, the method "lumps" together all the pressure drops caused by all tool joints in the drill string and then adds the total pressure drop due to the tool joints to the pressure drops caused by the drill pipe, excluding the tool joints. The sum of these pressure drops provides a more accurate calculation of the UBD parameters than either compensating for the tool joints by "fudging" the diameter of the drill pipe segments or simply ignoring the effect of the tool joints entirely. In one exemplary embodiment, in segment index number 1 shown in FIG. 2, the first drill pipe segment is 100 feet in length. According to an embodiment of the model, the segment information stored in the calculation array is divided into the length of the pipe versus the length of the tool joint. If, in this example, the drill pipe is nominally 5-inches OD, with a 6-inch OD tool joint that is 5 feet in length, then the drill pipe segment recorded in the calculation array would subdivided into a segment attributable to the pipe, which would be 95 feet of 5-inch OD, and a segment attributable to the tool joint, which would be 5 feet of 6-inch OD. A similar pipe segment in, for example index 2, would be treated the same way. The lumped data for both segments 1 and 2 would be 190 feet of 5-inch OD and 10 feet of 6-inch OD for the tool joint. This information would then be used in the appropriate UBD calculations to determining the pressure drop across segment indexes 1 and 2. The calculations for determining the pressure drops, as well as other relevant UBD calculations involving other matters necessary for designing and operating a well in an UBD condition are known to those of skill in the art.

Figure 3:
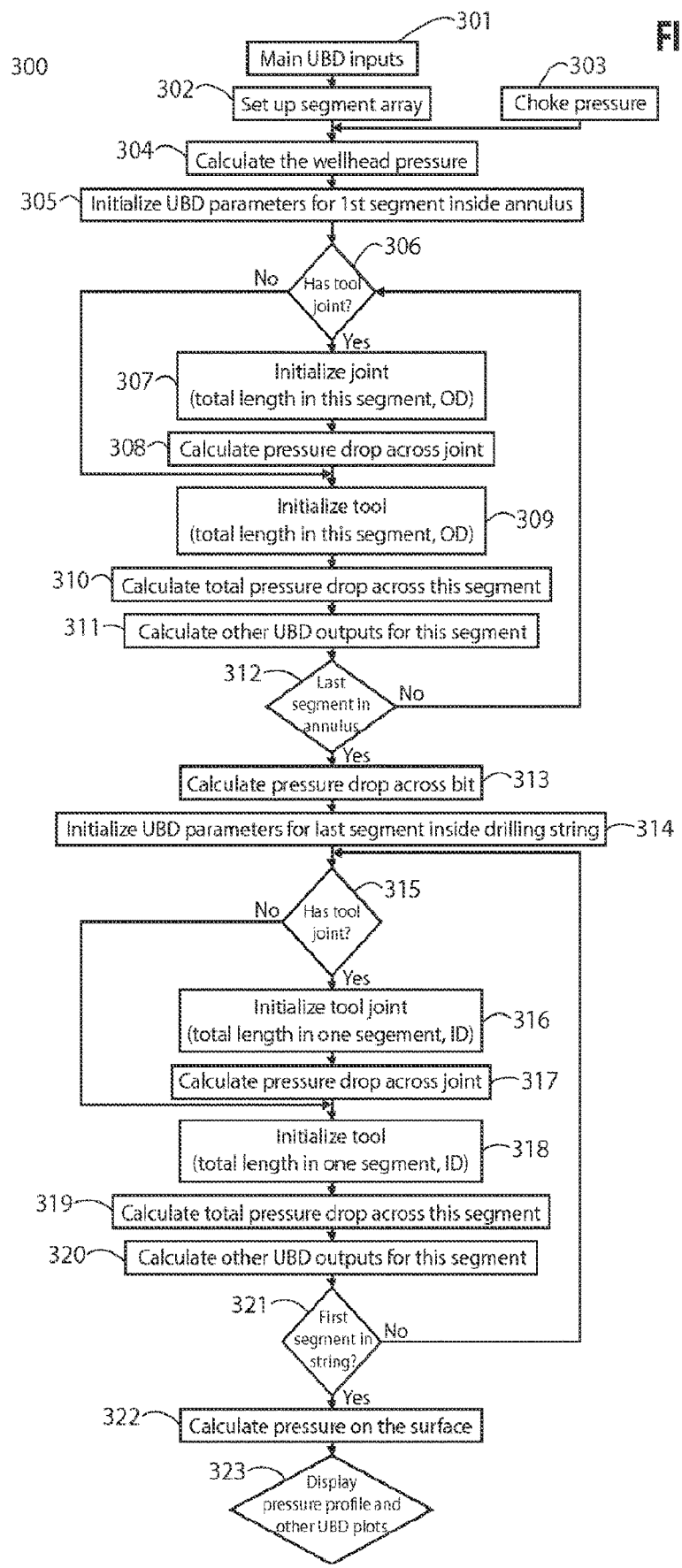
FIG. 3 is a flowchart illustrating an embodiment of the invention.

Referring now to FIG. 3, there is shown a flow chart illustrating a computer implemented embodiment in the invention. In block 301, the main underbalanced drilling inputs are supplied to the computer program. These inputs may be supplied in any way familiar to those of skill in the art. For example, they may be entered into the computer through a graphical-user interface ("GUI") and suitable input means, or they may be supplied electronically from a computer hard drive or other storage media, or supplied over a computer network, such as the Internet.

At block 302, the segment array is initialized or set up. This will allow the segment array to be configured using the information that reflects the drill string and casing used in the wellbore. The inputs include the drill pipe internal diameter (ID), outer diameter (OD) inside tool joint length, inside tool joint ID, outside tool joint length, outside tool joint OD, types of upsets, and length of pipe.

At block 303, the choke pressure is supplied. The choke pressure is the back pressure at the choke that is applied to achieve a desired bottom hole pressure. The method, then, in block 304, calculates the well head pressure.

At step 305, the underbalanced drilling parameters for the first segment inside the annulus are initialized. The method then proceeds to analyze all segments within the annulus. At decision block 306, the method checks the drill string and segment index number 1 to determine whether the drill string contains a tool joint. If not, the method skips to step 309 where it initializes the tool, that is, the memory structures containing the results of past calculations are nulled to as not to interfere with current calculations. In this block, the method adds the total length of the drill pipe in this segment, along with its outer diameter, into the calculation array for this segment. At block 310, the method then calculates the total pressure drop across this segment, based on the above parameters.

At block 311, the method then calculates other underbalanced drilling outputs for this segment, including bottom hole pressure, surface pressure, equivalent mud weight, and velocity of the fluid.

At block 312, the method then checks to see if there are any other segments in the annulus. If it is not the last segment in the annulus, then flow proceeds back to block 306 where the next segment is retrieved and tested to see if the segment has a tool joint. If the tool joint exists, then flow proceeds to block 307 where the tool joint is initialized with the total length of the tool joint and the outer diameter of the tool joint being provided to the calculation array. At block 308, the pressure drop across the tool joint is calculated. Flow then proceeds to blocks 309-311, however, in this case, the length of the drill pipe will be the length of the segment minus the length of the tool joint, which pressure drop has already been calculated. In this way, it will be understood that a segment is treated as two parts: tool only and joint only. The underbalanced drilling calculation is performed separately for each part, based on their equivalent length, inner diameters, and outer diameters. Of course, it will be understood that the inner diameters and outer diameters will vary according to the size of the drill pipe, and this information will be contained in the appropriate arrays. storing the information regarding the drill string and casing.

The method repeats steps 306-312 until all segments in the annulus have been accounted for. In this way, the entire pressure drop inside the annulus for both the drill pipe and the tool joints have been calculated. The flow then proceeds to step 314 where the method calculates the pressure drop across the drill bit. Once the pressure drops inside the annulus have been determined in steps 301-313, the method then proceeds to calculate the pressure drops for the fluid flow inside the drilling string. Therefore, flow proceeds to step 314 where the method initializes the underbalanced drilling parameters for the last segment inside the drilling string. Flow then proceeds to block 315 where the method checks with the information contained in the drill string array to determine this segment has a tool joint. If not, then flow proceeds to step 318 where the tool joint is initialized, that is, provided the total length of the segment and the inner diameter of the segment and this information is provided to the calculation array. Flow then proceeds to step 319-320 where the total pressure drop across the segment is calculated and other underbalanced drilling outputs for the segment are calculated.

Flow then proceeds to decision block 321 where the method checks to see if the segment just analyzed was the first segment in the string. If not, the method continues analyzing the string in reverse order and returns to block 315 for the segment just prior to the last segment in the drilling string where it again checks to see if this segment has a tool joint. If so, then control proceeds to block 316 where the calculations segment is initialized for this tool joint by providing it with the total length of the segment and the segment inner ID for the tool joint. Flow then proceeds to block 317 where the method calculates the pressure drop across the tool joint. Flow then proceeds to steps 318-320 where the tool is initialized for the length of the pipe, however, in this case, the length of the pipe will be reduced by the length of the tool joint. Flow then proceeds to step 321 where the method again checks to see if this is the first segment in the string. If not, then steps 315-320 are repeated until all segments for the drilling string have been analyzed and the pressure drops determined. At this point, the pressure drop for all tool joints, along with the pressure drops for the pipe segments themselves, both inside the pipe string and inside the annulus of the casing and open hole will have been determined. This information is then provided as a lumped input to be used by other underbalanced drilling calculations to determine various parameters important to the underbalanced drilling engineer. At block 122, the pressure on the surface is then calculated. At block 123, the pressure profile and other underbalanced drilling plots then may be displayed on a computer screen to the underbalanced drilling engineer who may then make suitable operational design choices, based upon a more accurate understanding of the effect of the tool joints in the well.

Of course, it will be understood that not all segments may contain string types having tool joints. If a calculation segment does not contain string types having tool joints, then only the string length within it is used to determine the pressure drop for that segment.

In embodiments, the UBD calculation is performed on the whole segment. For example, the calculation segment with index 7 as shown in FIG. 2.

In an embodiment, the UBD calculation is performed starting from wellhead, using calculation segments, which may be implemented as arrays, stored inside computer memory. The work flow or the calculations may begin with the area inside the annulus, beginning from the top of the well to the bottom, then proceed using a calculation segment array for the drilling strings, from the bottom of the well to the surface.

After the calculations are performed, the UBD plots may be displayed to the operator, showing the pressure drops caused by the string and tool joints. This allows the UBD engineers to consider the effect of the tool joints in the design and operation of the well and to make more informed decisions on the selection of drilling strings based upon more accurate, realistic, and reliable information.

The computer implemented method described in these embodiments provides a UBD engineer with the ability to calculate tool joints effects in an underbalanced drilling operation. Further, implementations of the invention provide a lumped data model for tool joints effect may be more efficient than a discrete data model and provide more accurate and realistic calculation for UBD.

FIG. 4 is a block diagram illustrating one embodiment of a system 400 for implementing the features and functions of the disclosed embodiments. The system 400 may be any type of computing device such as, but not limited to, a personal computer, a server system, a client system, a laptop, a tablet, and a smartphone. The system 400 includes, among other components, a processor 410, main memory 402, secondary storage unit 404, an input/output interface module 406, and a communication interface module 408. The processor 410 may be any type or any number of single core or multi-core processors capable of executing instructions for performing the features and functions of the disclosed embodiments.

The input/output interface module 406 enables the system 400 to receive user input (e.g., from a keyboard and mouse) and output information to one or more devices such as, but not limited to, printers, external data storage devices, and audio speakers. The system 400 may optionally include a separate display module 412 to enable information to be displayed on an integrated or external display device. For instance, the display module 412 may include instructions or hardware (e.g., a graphics card or chip) for providing enhanced graphics, touchscreen, and/or multi-touch functionalities associated with one or more display devices.

Main memory 402 is volatile memory that stores currently executing instructions/data or instructions/data that are prefetched for execution. The secondary storage unit 404 is non-volatile memory for storing persistent data. The secondary storage unit 404 may be or include any type of data storage component such as a hard drive, a flash drive, or a memory card. In one embodiment, the secondary storage unit 404 stores the computer executable code/instructions and other relevant data for enabling a user to perform the features and functions of the disclosed embodiments.

For example, in accordance with the disclosed embodiments, the secondary storage unit 404 may permanently store the executable code/instructions associated with a casing design application 420 for performing the above-described methods. The instructions associated with the casing design algorithm 420 are loaded from the secondary storage unit 404 to main memory 402 during execution by the processor 410 for performing the disclosed embodiments.

The communication interface module 408 enables the system 400 to communicate with the communications network 430. For example, the network interface module 408 may include a network interface card and/or a wireless transceiver for enabling the system 400 to send and receive data through the communications network 430 and/or directly with other devices.

The communications network 430 may be any type of network including a combination of one or more of the following networks: a wide area network, a local area network, one or more private networks, the Internet, a telephone network such as the public switched telephone network (PSTN), one or more cellular networks, and wireless data networks. The communications network 630 may include a plurality of network nodes (not depicted) such as routers, network access points/gateways, switches, DNS servers, proxy servers, and other network nodes for assisting in routing of data/communications between devices.

For example, in one embodiment, the system 400 may interact with one or more servers 434 or databases 432 for performing the features of the present invention. For instance, the system 400 may query the database 432 to obtain well data for updating the three dimensional tunnel view of the operating envelope in real-time in accordance with the disclosed embodiments. Further, in certain embodiments, the system 400 may act as a server system for one or more client devices or a peer system for peer to peer communications or parallel processing with one or more devices/computing systems (e.g., clusters, grids).

While specific details about the above embodiments have been described, the above hardware and software descriptions are intended merely as example embodiments and are not intended to limit the structure or implementation of the disclosed embodiments. For instance, although many other internal components of the system 400 are not shown, those of ordinary skill in the art will appreciate that such components and their interconnection are well known.

In addition, certain aspects of the disclosed embodiments, as outlined above, may be thought of as "products" or "articles of manufacture" typically in the form of executable code and/or associated data that is carried on or embodied in a type of tangible non-transitory machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the executable code.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In a further embodiment, there is provided a computer-implemented method for determining underbalanced drilling conditions. The methods includes determining the number of tool joints in a segment of drill string, each tool joint having a length and an inner diameter and an outer diameter, determining the total length of all tool joints in the segment of drill string, determining the total length of the segment of drill string excluding the total length of all tool joints in the segment of drill string, wherein the drill string has an inner diameter and an outer diameter, determining the inner diameter of a segment of wellbore encompassing the segment of drill string, and determining a pressure drop in a segment of the wellbore based on the on the total length of all tools joints in the segment of drill string, the total length of the segment of drill string excluding the total length of all tool joints in the segment of drill string, the outer diameter of the tool joints, the outer diameter of the drill string, and the inner diameters of the tool joints, the drill string, and the wellbore.

In another embodiment, there is provided a computer readable medium comprising computer executable instructions for determining underbalanced drilling conditions that when executed cause one or more machines to perform operations that include determining the number of tool joints in a segment of drill string, each tool joint having a length and an inner diameter and an outer diameter, determining the total length of all tool joints in the segment of drill string, determining the total length of the segment of drill string excluding the total length of all tool joints in the segment of drill string, wherein the drill string has an inner diameter and an outer diameter, determining the inner diameter of a segment of wellbore encompassing the segment of drill string, and determining a pressure drop in a segment of the wellbore based on the on the total length of all tools joints in the segment of drill string, the total length of the segment of drill string excluding the total length of all tool joints in the segment of drill string, the outer diameter of the tool joints, the outer diameter of the drill string, and the inner diameters of the tool joints, the drill string, and the wellbore.

Still a further embodiment provides a system for performing underbalanced drilling operations that includes at least one processor having a computer memory including stored instructions that when executed cause at least one processor to perform operations of determining the number of tool joints in a segment of drill string, each tool joint having a length and an inner diameter and an outer diameter, determining the total length of all tool joints in the segment of drill string, determining the total length of the segment of drill string excluding the total length of all tool joints in the segment of drill string, wherein the drill string has an inner diameter and an outer diameter, determining the inner diameter of a segment of wellbore encompassing the segment of drill string, and determining a pressure drop in a segment of the wellbore based on the on the total length of all tools joints in the segment of drill string, the total length of the segment of drill string excluding the total length of all tool joints in the segment of drill string, the outer diameter of the tool joints, the outer diameter of the drill string, and the inner diameters of the tool joints, the drill string, and the wellbore.

While the disclosed embodiments have been described with reference to one or more particular implementations, those skilled in the art will recognize that many changes may be made thereto without departing from the spirit and scope of the description. Accordingly, each of these embodiments and obvious variations thereof is contemplated as falling within the spirit and scope of the claimed invention, which is set forth in the following claims.

What is claimed is:

1. A computer-implemented method for determining underbalanced drilling conditions, comprising:
   a) determining a number of upset tool joints in a segment of drill string, each upset tool joint having a length and an inner diameter and an outer diameter, and wherein the outer diameter of each upset tool joint is larger in diameter than the outer diameter of the drill string adjacent to the tool joint, wherein the segment of drill string has a predetermined fixed length;
   b) determining a total length of all upset tool joints in the segment of drill string;
   c) determining a total length of the segment of drill string excluding the total length of all upset tool joints in the segment of drill string, wherein the drill string has an inner diameter and an outer diameter;
   d) determining an inner diameter of a segment of wellbore encompassing the segment of drill string, wherein the segment of wellbore has a predetermined fixed length;
   e) determining a pressure drop in the segment of the wellbore based on the on the total length of all upset tool tools joints in the segment of drill string, the total length of the segment of drill string excluding the total length of all upset tool joints in the segment of drill string, the outer diameter of the upset tool joints, the outer diameter of the drill string, and the inner diameters of the upset tool joints, the drill string, and the segment of the wellbore;
   f) repeating steps a) through e) until the segment of wellbore comprises a transition region that has both cased and uncased sections of wellbore;
   g) dividing the predetermined fixed length of the segments of the drill string and the wellbore into lengths reflecting the length of the cased and uncased sections;
   h) repeating steps a) through e) using the divided lengths of the segments of the drill string and the wellbore rather than the predetermined fixed lengths;
   i) repeating steps a) through e) using the predetermined fixed lengths of the segment of the drill string and the segment of the wellbore until the wellbore encompasses a bottom hole assembly; and
   k) allowing a drilling engineer to select a drilling string, based upon the pressure drop in the segments of the wellbore which have a predetermined fixed length and the segments of the wellbore which have a divided length, that is adapted to maintain the wellbore in an underbalanced condition during drilling.

2. A computer-implemented method according to claim 1 wherein the total pressure drop from all upset tool joints in the drill string is calculated and displayed as a lump sum pressure drop.

3. A computer-implemented method according to claim 1 wherein the total pressure drop for the drill string excluding the total pressure drops due to the upset tool joints is displayed as a lump sum pressure drop.

4. A non-transitory computer readable medium comprising computer executable instructions for determining underbalanced drilling conditions that when executed cause one or more machines to perform operations comprising:

a) determining a number of upset tool joints in a segment of drill string, each upset tool joint having a length and an inner diameter and an outer diameter, and wherein the outer diameter of each upset tool joint is larger in diameter than the outer diameter of the drill string adjacent to the tool joint, wherein the segment of drill string has a predetermined fixed length;

b) determining a total length of all upset tool joints in the segment of drill string;

c) determining a total length of the segment of drill string excluding the total length of all upset tool joints in the segment of drill string, wherein the drill string has an inner diameter and an outer diameter;

d) determining an inner diameter of a segment of wellbore encompassing the segment of drill string, wherein the segment of wellbore has a predetermined fixed length;

e) determining a pressure drop in the segment of the wellbore based on the on the total length of all tools upset tool joints in the segment of drill string, the total length of the segment of drill string excluding the total length of all upset tool joints in the segment of drill string, the outer diameter of the upset tool joints, the outer diameter of the drill string, and the inner diameters of the upset tool joints, the drill string, and the segment of the wellbore;

f) repeating steps a) through e) until the segment of wellbore comprises a transition region that has both cased and uncased sections of wellbore;

g) dividing the predetermined fixed length of the segments of the drill string and the wellbore into lengths reflecting the length of the cased and uncased sections;

h) repeating steps a) through e) using the divided lengths of the segments of the drill string and the wellbore rather than the predetermined fixed lengths;

j) repeating steps a) through e) using the predetermined fixed lengths of the segment of the drill string and the segment of the wellbore until the wellbore encompasses a bottom hole assembly; and k) allowing a drilling engineer to select a drilling string, based upon the pressure drop in the segments of the wellbore which have a predetermined fixed length and the segments of the wellbore which have a divided length, that is adapted to maintain the wellbore in an underbalanced condition during drilling.

5. A computer readable medium according to claim 4 wherein the total pressure drop from all upset tool joints in the drill string is calculated and displayed as a lump sum pressure drop.

6. A computer readable medium according to claim 4 wherein the total pressure drop for the drill string excluding the total pressure drops due to the upset tool joints is displayed as a lump sum pressure drop.

7. A system for performing underbalanced drilling operations, comprising:

at least one processor having a computer memory including stored instructions that when executed cause the at least one processor to perform operations comprising:

a) determining a number of upset tool joints in a segment of drill string, each upset tool joint having a length and an inner diameter and an outer diameter, and wherein the outer diameter of each upset tool joint is larger in diameter than the outer diameter of the drill string adjacent to the tool joint, wherein the segment of drill string has a predetermined fixed length;

b) determining a total length of all upset tool joints in the segment of drill string;

c) determining a total length of the segment of drill string excluding the total length of all upset tool joints in the segment of drill string, wherein the drill string has an inner diameter and an outer diameter;

d) determining an inner diameter of a segment of wellbore encompassing the segment of drill string, wherein the segment of wellbore has a predetermined fixed length;

e) determining a pressure drop in the segment of the wellbore based on the on the total length of all upset tool tools joints in the segment of drill string, the total length of the segment of drill string excluding the total length of all upset tool joints in the segment of drill string, the outer diameter of the upset tool joints, the outer diameter of the drill string, and the inner diameters of the upset tool joints, the drill string, and the segment of the wellbore;

f) repeating steps a) through e) until the segment of wellbore comprises a transition region that has both cased and uncased sections of wellbore;

g) dividing the predetermined fixed length of the segments of the drill string and the wellbore into lengths reflecting the length of the cased and uncased sections;

h) repeating steps a) through e) using the divided lengths of the segments of the drill string and the wellbore rather than the predetermined fixed lengths;

j) repeating steps a) through e) using the predetermined fixed lengths of the segment of the drill string and the uncased segment of the wellbore until the wellbore encompasses a bottom hole assembly; and k) allowing a drilling engineer to select a drilling string, based upon the pressure drop in the segments of the wellbore which have a predetermined fixed length and the segments of the wellbore which have a divided length, that is adapted to maintain the wellbore in an underbalanced condition during drilling.

8. A system according to claim 7 wherein the total pressure drop from all upset tool joints in the drill string is calculated and displayed as a lump sum pressure drop.

9. A system according to claim 7 wherein the total pressure drop for the drill string excluding the total pressure drops due to the upset tool joints is displayed as a lump sum pressure drop.

* * * * *